United States Patent
Dawber et al.

Patent Number: 5,585,714
Date of Patent: Dec. 17, 1996

[54] WIDE BANDWIDTH RF SPECTRUM ANALYSER

[75] Inventors: William Dawber, Kingston Nr Lewes; Colin J. Flynn, Denmead; Herbert A. French, Emsworth, all of England; Arthur Maitland, St. Andrews, Scotland; Andrew P. Shaw, Emsworth, England

[73] Assignee: The Secretary of State for Defence in Her Britannic Majesty's Government of the United Kingdom of Great Britain and Northern Ireland, London

[21] Appl. No.: 859,697

[22] PCT Filed: Oct. 19, 1990

[86] PCT No.: PCT/GB90/01612

§ 371 Date: Jun. 11, 1992

§ 102(e) Date: Jun. 11, 1992

[87] PCT Pub. No.: WO91/06014

PCT Pub. Date: May 2, 1991

[30] Foreign Application Priority Data

Oct. 19, 1989 [GB] United Kingdom ............ 8923555

[51] Int. Cl.⁶ .................................................. G06G 7/19
[52] U.S. Cl. .................................... 324/76.37; 364/822
[58] Field of Search .............................. 372/13, 12, 20; 359/247; 350/388; 364/822; 324/76.37

[56] References Cited

U.S. PATENT DOCUMENTS

| | | | |
|---|---|---|---|
| 4,467,276 | 8/1984 | Marten et al. | |
| 4,528,669 | 7/1985 | Bostick | 372/26 |
| 4,531,196 | 7/1985 | Lin | 364/822 |
| 4,531,197 | 7/1985 | Lin | 364/822 |
| 4,586,184 | 4/1986 | Hess | 372/20 |
| 4,633,170 | 12/1986 | Burns | |
| 4,707,835 | 11/1987 | Mocker | 372/13 |
| 4,728,168 | 3/1988 | Alferness | 372/26 |
| 4,833,681 | 5/1989 | Akiyama | 372/26 |
| 4,991,178 | 2/1991 | Wani | 372/20 |
| 5,027,360 | 6/1991 | Nabors | 372/26 |
| 5,048,029 | 9/1991 | Skupsky | 372/26 |
| 5,181,210 | 1/1993 | Chung | 372/19 |
| 5,199,038 | 3/1993 | Vahala | 372/20 |
| 5,230,005 | 7/1993 | Rubins | 372/20 |

FOREIGN PATENT DOCUMENTS

| | | |
|---|---|---|
| 2113834 | 8/1983 | United Kingdom . |
| 2144848 | 8/1983 | United Kingdom . |
| 2146766 | 9/1984 | United Kingdom . |

*Primary Examiner*—Kenneth A. Wieder
*Assistant Examiner*—Jose M. Solis
*Attorney, Agent, or Firm*—Nixon & Vanderhye P.C.

[57] ABSTRACT

A broadband electrical signal spectrum analyser comprises a spatial light modulator such as a Bragg cell located within at least one resonant cavity and illuminated by a polychromatic source of light. The signal to be analysed is connected to the Bragg cell. The tuned cavity is arranged to lase the diffracted light to thereby enhance the signal before detection. In one arrangement the cavity is formed by opposed mirrors set at the Bragg angle and one of the mirrors is oscillated through a range of frequencies required by the broadband application. In a second arrangement a plurality of narrow band channels is formed by a fibre optic array. The fibres are arranged such that first ends of the fibres form a linear input array and the second ends form a linear output array. Light at the Bragg angle passes into an appropriate one or more of the output array fibres, passes around the looped fibres to the input array where the light (zero order) is transmitted through the Bragg cell and then back to the fibre loop. A collimating lens is provided on the input side of the Bragg cell and a Fourier transforming lens is provided on the output side of the Bragg cell such that the position of the optical fibre in the array carrying the diffracted light is frequency dependent and the amount of light depends on the amplitude of that frequency in the electrical signal.

12 Claims, 3 Drawing Sheets

WIDE BANDWIDTH RF SPECTRUM ANALYSER

BACKGROUND OF THE INVENTION

1. Field of the Invention

The invention relates to radio-frequency spectrum analysers using optical rf modulators for analysing signals and in particular though not exclusively to spectrum analysers employing Bragg cells in resonant cavities.

2. Discussion of Prior Art

One method for spectrum analysis of an FM signal is to apply the signal to a Bragg cell and measure the optical diffraction effects produced by the interaction of laser light and the acoustic waves present in the Bragg cell. The performance of Bragg cells in this application have the following performance limitations:

a) limited frequency bandwidth at high diffraction efficiency;

b) limited dynamic range; and c) significant material intermodulation effects.

Steir et al, Applied Physics 27, No 8 (15 Apr. 1988), have shown that the diffraction efficiency of a stationary grating may be improved by placing the grating in a resonant cavity. The Bragg cell may be placed in a two-mirror resonant cavity, with one mirror 100% reflecting and the other mirror partially reflecting and this results in enhanced Bragg cell diffraction. This arrangement can be used in a white light RF spectrum analyser. The inventor has shown, however, that a practical spectrum analyser using monochromatic light cannot be based on this configuration. Another possible arrangement utilises a four mirror confocal cavity where the round trip path length for a ray of light remains constant for small changes in the Bragg angle. These arrangements have been shown to have limited bandwidth and resolution.

SUMMARY OF THE INVENTION

The object of the invention is to provide a wideband resonant cavity spectrum analyser which overcomes problems associated with known arrangements.

The invention provides a broadband electrical signal spectrum analyser comprising:

a spatial light modulating cell;

at least one resonant cavity in which the modulating cell is located;

a source of light for providing a beam to illuminate the cavity; and means to connect the signal to the modulating cell; the arrangement being such that the cavity can be tuned to different wavelengths so as to provide multiple channel, broadband frequency response.

In an advantageous arrangement the spatial light modulating cell is an acousto-optic Bragg cell. Other arrangements are envisaged, however, in which equivalent diffraction occurs, as for example by changes of polarisation induced by the applied signal to be analysed.

Advantageously an optical gain medium may be present such that each tuned cavity provides narrow-band lasing which enhances the Bragg cell efficiency. In one arrangement a plurality of fixed resonant cavities is formed by providing a fibre optic array. Advantageously the fibres of the array are arranged such that a linear array of input ends is formed on one side of the Bragg cell and the respective other ends of the optical fibres form a linear output array on the opposed side of the Bragg cell.

Advantageously each of the optical fibres is passed around a piezo-electric cylinder to keep the cavities tuned to their respective wavelengths. A fibre optic copuling arrangement may be used to couple light from each resonant optical fibre cavity to an output optical fibre connected to an optical detector. Advantegeously the optical detectors may be photodiodes. In an alternative arrangement a single dynamic cavity is provided by locating the Bragg cell between a totally relflecting mirror and a partially reflecting mirror and vibrating means connected to one mirror such that the tuned cavity scans a range of wavelengths. Advantageously a slit is provided in the image plane behind the partially transparent mirror and a detector is arranged to detect light passing through the slit.

Advantageously white light is used with a collimating lens being provided on one input side of the Bragg cell and a Fourier transforming lens being provided on the output side of the Bragg cell. Advantageously a high "Q" Bragg cell is used.

BRIEF DESCRIPTION OF THE DRAWINGS

The invention will now be described by way of example only with reference to the accompanying Drawings of which.

DETAILED DISCUSSION OF PREFERRED EMBODIMENTS

Figure 1:
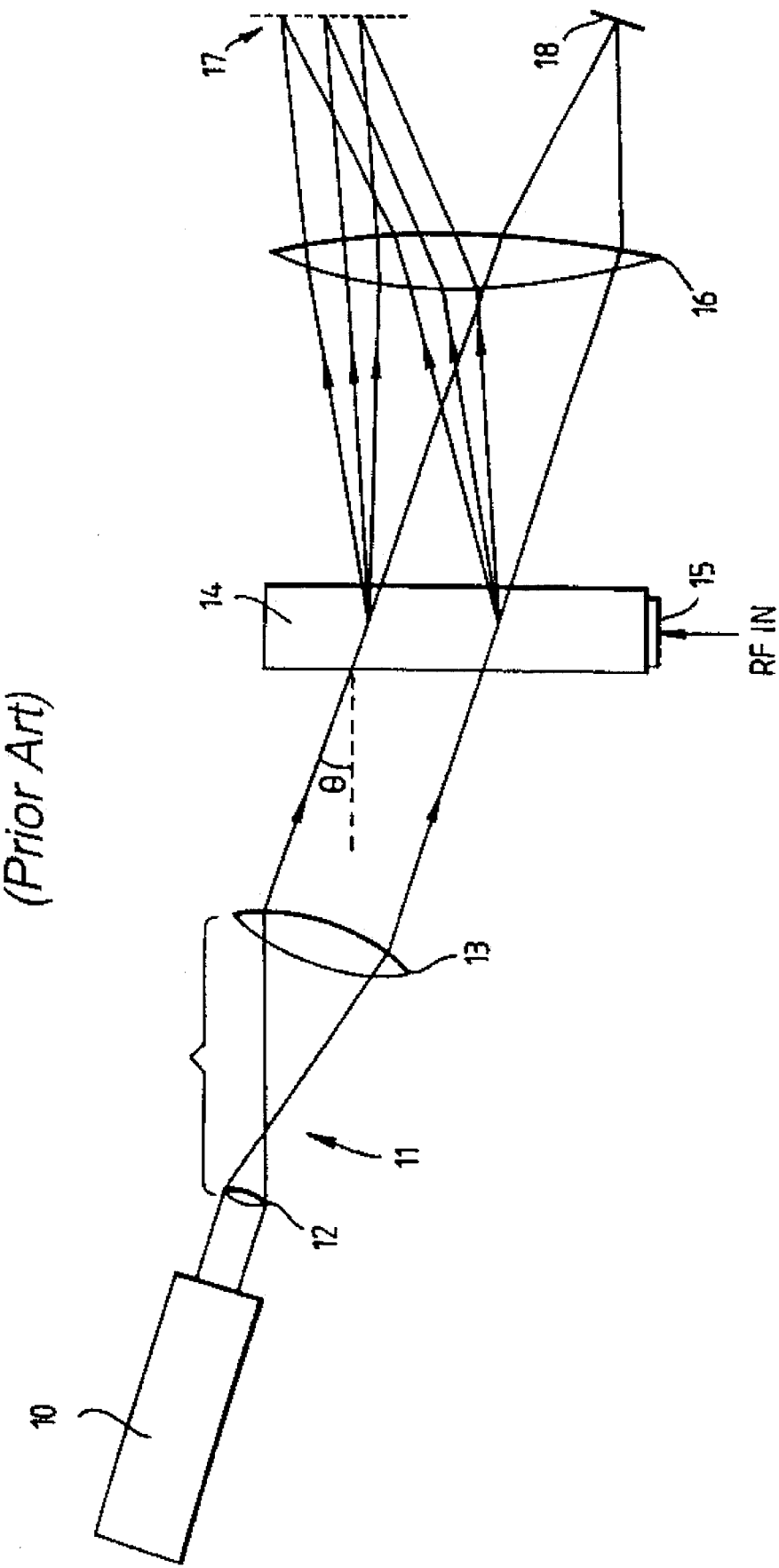
FIG. 1 shows a known laser RF signal spectrum analyser.

As shown in FIG. 1, in a typical acousto-optic spectrum analyser, light from a laser 10 is collimated (11) by an arrangement of lenses 12,13 with a narrow slit (not shown) between to provide a broad beam incident on an acousto-optic Bragg cell 14. A radio frequency (RF) signal to be analysed is coupled to the Bragg cell by a transducer 15, producing propagating acoustic waves within the Bragg cell. The quasi-monochromatic light incident on the Bragg cell 14 interacts with the acoustic field therein to produce a diffraction pattern which is examined in the focal plane of a Fourier transforming lens 16 by an array of detectors 17. A stop 18 is provided to block undiffracted zero-order light. The Bragg cell 14 is positioned such that the angle of incidence of the laser light is fixed. As the frequency of the acoustic wave in the Bragg cell changes, the position of the light focused by lens 16 also changes. Thus the outputs from the array 17 can be used to analyse the RF signal applied to the Bragg cell. When used in this way, there is poor frequency response and the performance is limited by intermodulation effects. Intermodulation effects arise because of three effects:

a) Hecht intermodulation due to light being diffracted more than once by the acoustic signal;

b) material intermodulation due to the non-linear factors in the interaction equation and the breakdown of linearity at high acoustic power densities; and c) amplifier intermodulations due to the large gains often required in practical applications.

In order to improve the bandwidth of the RF spectrum analyser, polychromatic white light sources have been tried. In one arrangement collimated light is incident on the Bragg cell. The diffracted light at one output angle of diffraction (equal to the input angle) is monitored with an optical spectrometer. As the radio-frequency in the cell changes, the wavelengths of the light incident on the spectrometer changes. There is always an optical wavelength which satisfies the Bragg condition for diffraction at a given radio-frequency and hence the bandwidth is limited only by the transducer and polychromatic source bandwidths. However, in practice, resolution of the spectrometer is limited by the degree of collimation of the incident light we have:

$$\frac{\lambda}{\delta\lambda} = \frac{\theta}{\delta\theta}$$

where $\lambda$ is the wavelength, $\theta$ is the Bragg angle, $\delta\lambda$ is the optical bandwidth and $\delta\theta$ is the degree of collimation.

When using an arc lamp as the polychromatic source, the beam is collimated by focusing it onto a slit. The angular width subtended by the slit at the collimating lens system determines the degree of collimation. The resolution lens system determines the degree of collimation. The resolution achievable is inversely related to the slit width, however the narrower the slit the lower the intensity of the light. So we seek a trade-off between resolution and intensity reaching the detectors. The inventors have shown that a high "Q" transducer 15 is likely to reduce intermodulation effects (and thereby increase the dynamic range) but with a penalty of a reduction in the monochromatic frequency bandwidth, a penalty which may be overcome by, for example, using polychromatic illumination of the Bragg cell.

Figure 2:
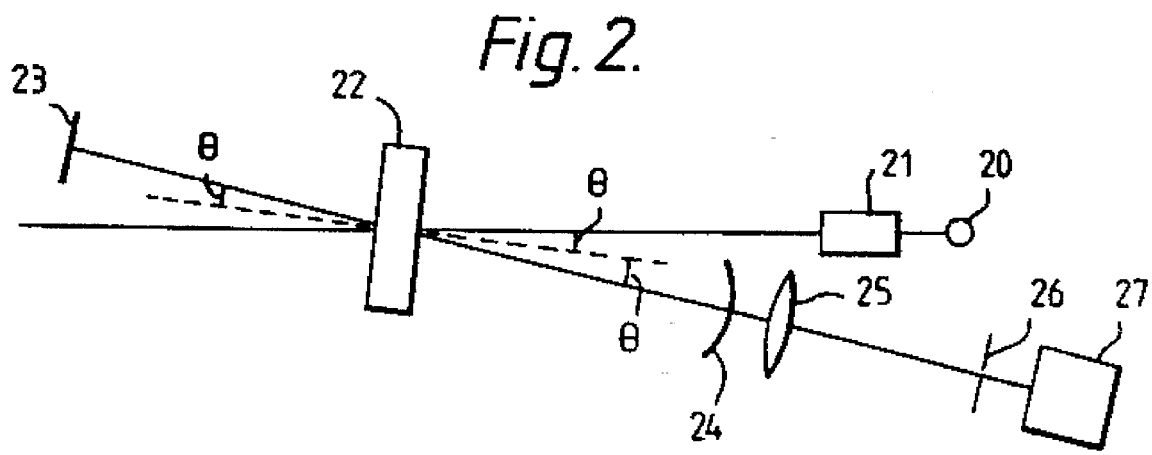
FIG. 2 shows a white light RF spectrum analyser using cavity enhanced diffraction.

FIG. 2 shows an RF spectrum analyser according to the invention where a Bragg cell is placed in a tunable resonant cavity which may have gain. Light from an arc lamp 20 after collimation (21) is incident at angle $\theta$ on a Bragg cell 22. The cell 22 is located in a lasing cavity defined by a 100% reflecting mirror 23 and a partially reflecting mirror 24. Light diffracted at an angle $\theta$ to the normal is reflected back and forth between the mirrors 23 and 24. Light which is transmitted by the partially reflecting mirror 24 is focused by a lens 25 to a slit in a screen where it is viewed by a detector 27. In this arrangement the wavelength of the diffracted light reaching the slit in the screen 26 is inversely proportional to the frequency applied to the Bragg cell 22. The mirror 23 is vibrated with an amplitude sufficient to change the cavity resonance frequency through the required spectral range. The wavelength which is diffracted to the slit will then be on resonance in the cavity twice during each cycle. The light detected by the detector 27 is a series of pulses of amplitude proportional to the amplitude of the RF applied to the cell 22 for low diffraction efficiencies. It has been found that the cell 22 starts to saturate for cell efficiencies above about 5% and thus the usable dynamic range is limited to input RF powers less than those which give greater than 5% cell efficiencies.

Figure 3:
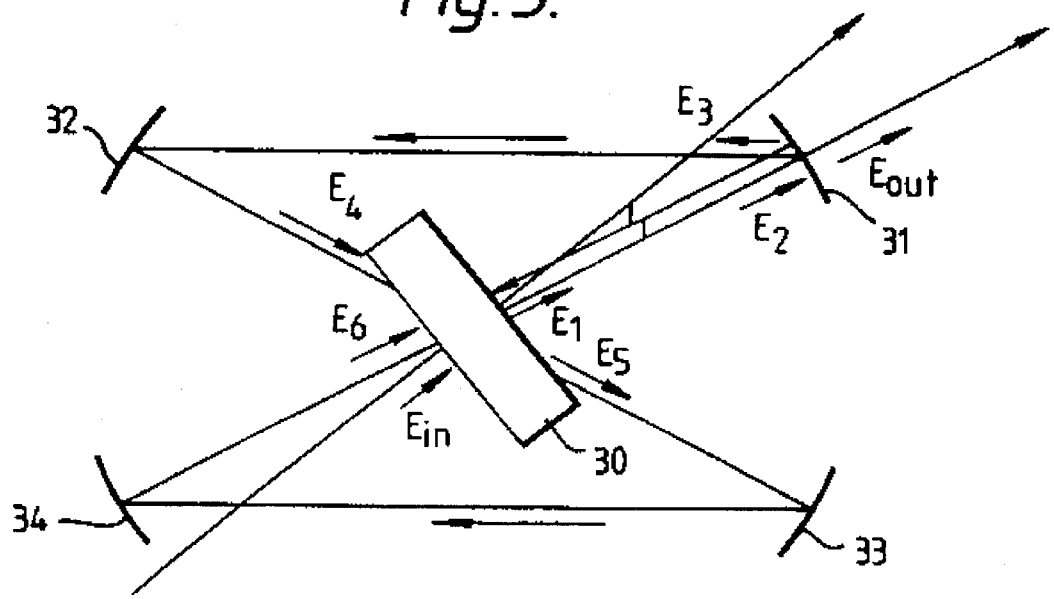
FIG. 3 illustrates a four mirror confocal cavity configuration of the invention.

FIG. 3 shows an alternative arrangement in which a Bragg cell 30 is located within a four mirror (31–34) confocal cavity. Incident radiation $E_{in}$, is diffracted by the Bragg cell ($E_1$) and is then partially transmitted by the first mirror 31 to provide output radiation $E_{out}$. Radiation $E_3$, reflected at the mirror 31, is reflected via mirrors 32–34 back to mirror 31 where it partially supplements the initially transmitted radiation. For small changes in the Bragg angle the round trip path length remains constant in this cavity. If gain is introduced into the cavity then lasing occurs when the round trip gain equals the round trip loss. The usable bandwidth of the combined cavity and Bragg cell is limited, for monochromatic systems, by the bandwidth of the cavity with the cell in it. This is given, approximately, by:

$$\Delta v = cf/L$$

where F is the round trip cavity loss and L is the optical path length for the round trip.

For small diffraction efficiencies the output intensity, $I_{out}$, varies linearly with the diffraction from the cell 30 and the dynamic range of the cell/cavity combination is similar to that of the cell alone. The angular resolution of the cavity/cell combination is approximately the same as that of the cell alone.

Figure 4:
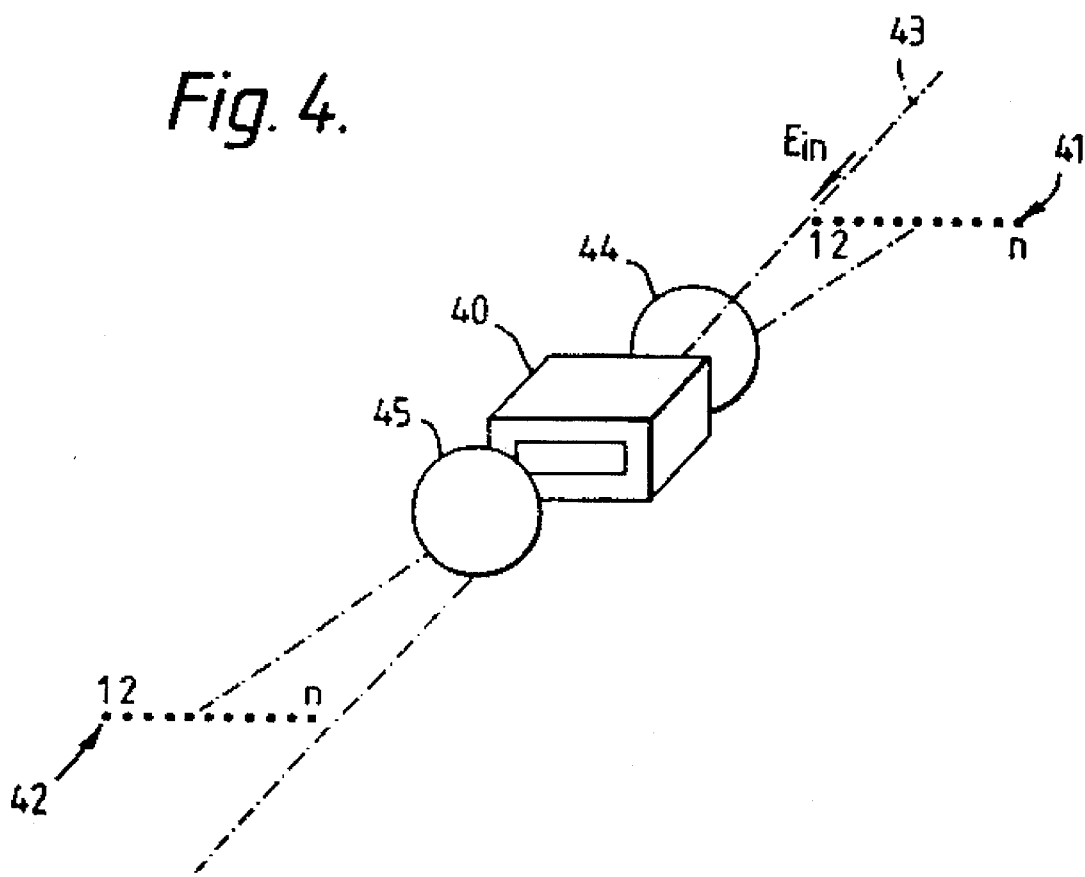
FIG. 4 shows a schematic diagram of an alternative RF spectrum analyser using a fibre optic array.

To avoid the problems of limited bandwidth and resolution imposed by the above monochromatic systems, a multiple cavity system could be used. For each frequency channel, a different cavity is used, tuned to its respective wavelength. FIG. 4 illustrates an arrangement of the invention having a single Bragg cell 40 located within a plurality of fixed resonant cavities formed by a fibre optic array; each fibre forming one optical cavity. Fibres 1 to n of a fibre optic array are arranged such that one set of ends forms a linear input array 41 at the optical input side of the Bragg cell 40 while the other ends of the fibres are arranged to form a linear output array 42 on the optical output side of the Bragg cell. Light 43 from a monochromatic source is incident on the Bragg cell 40 after transmission through a collimating lens 44. A Fourier transform lens 45 focuses diffracted light towards the output array of optical fibres 1 to n. After Fourier transformation the spatial position in the image plane of the FT lens 45 corresponds to the frequency of the light emerging from the Bragg cell 40. As in the previous arrangement an electrical signal to be analysed is connected to the Bragg cell such that the acoustic field formed therein interacts with the incident light 43 to produce diffracted light dependent on the amplitude and frequency of the spectral composition of the electrical signal.

Figure 5:
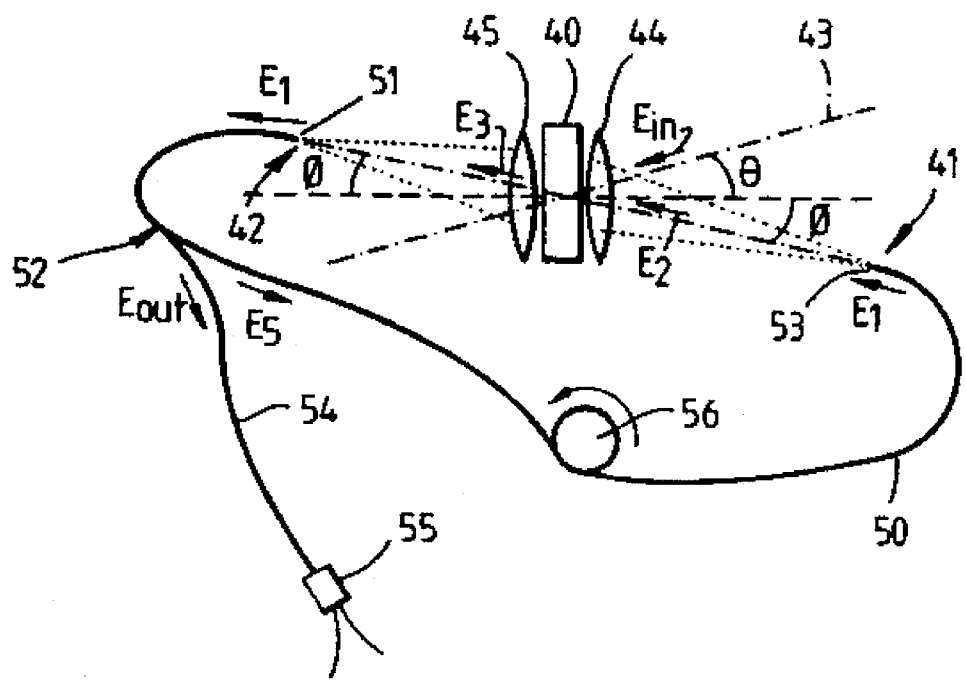
FIG. 5 shows in greater detail one fibre optic channel of the FIG. 3 arrangement.

FIG. 5 shows one monomode fibre optic channel 50 in greater detail. Input light impinges on the Bragg cell 40 at an angle of incidence $\theta$ and the linear input and output arrays 41 and 42 are arranged to receive/transmit diffracted light at a range of diffraction angles $\phi$. As shown, diffracted light enters the end 51 of the optical fibre 50 in the output array 42. It is then transmitted through the optical fibre via a fibre optic coupling 52 to the opposed end 53 in the input array 41. Diffracted light emerging from the end 53 of the optical fibre is incident on the Bragg cell and the zeroth order is transmitted linearly through the Bragg cell to enhance the diffracted radiation entering the end 42 of the fibre 50. In this manner diffracted light is circulated repeatedly around the fibre 50 and through the Bragg cell. A proportion of the diffracted light is coupled to an output monomode optical fibre 54 in the coupling 52. The repeated transmission of the diffracted light through the Bragg cell enhances the signal received by the output fibre 54. A photodiode 55 is provided to measure light in the output fibre 54. The optical fibre 50 thus forms one fibre ring cavity where the cavity length can be tuned by appropriate selection of the length of the optical fibre 50. The optical fibre is passed around a piezo-electric cylinder 56 to enable the length and hence the tuning of the ring to be maintained within narrow limits. In like manner each optical fibre in the array is tuned so as to provide n frequency channels with appropriately tuned resonant cavities. The full width of the Bragg cell 40 can be illuminated, so that with this arrangement the resolution and the bandwidth are maintained whilst still retaining the diffraction efficiency of the cavity.

The use of enhanced Bragg cell diffraction should allow large reductions in intermodulation by reducing the acoustic power densities required within the cell. In addition, the invention provides a practical white light system with a very high resolution and large bandwidth without the usual problems associated with extremely low light levels.

Although the invention has been described in relation to the acousto-optic effect in a Bragg cell to produce diffraction of transmitted light other spatial light modulators may be used in the manner taught by this invention so as to produce broadband performance. One such possibility is to make use of a cell in which the polarisation of a transmitted beam can be modulated by an applied rf signal.

We claim:

1. A broadband electrical signal spectrum analyser comprising:

a spatial light modulating cell, a frequency stable source of light providing a beam to illuminate the modulating cell, means for connecting the signal to the modulating cell at lease one resonant cavity in which the modulating cell is located; said cavity including means for tuning said cavity to different wavelengths for providing multiple channel, broadband frequency response.

2. A broadband electrical signal spectrum analyser as claimed in claim 1 characterised in that the spatial light modulating cell is an acousto-optic Bragg cell.

3. A broadband electrical signal spectrum analyser as claimed in claim 1 characterised in that an optical gain medium is present such that each tuned cavity provides narrow-band lasing which enhances the modulating cell efficiency.

4. A broadband electrical signal spectrum analyser as claimed in claim 1 characterised in that a plurality of fixed resonant cavities is formed by providing a fibre optic array.

5. A broadband electrical signal spectrum analyser as claimed in claim 4 characterised in that the fibres of the array are arranged such that a linear array of input ends is formed on one side of the modulating cell and the respective other ends of the optical fibres form a linear output array on the opposed side of the modulating cell.

6. A broadband electrical signal spectrum analyser as claimed in claim 5 characterised in that each of the optical fibres is passed around a piezo-electric cylinder to keep the cavities tuned to their respective wavelengths.

7. A broadband electrical signal spectrum analyser as claimed in claim 6 characterised in that a fibre optic coupling arrangement is used to couple light from each resonant optical fibre cavity to an output optical fibre connected to an optical detector.

8. A broadband electrical signal spectrum analyser as claimed in claim 7 characterised in that the optical detectors are photodiodes.

9. A broadband electrical signal spectrum analyser as claimed in claim 1 wherein said cavity comprises a single dynamic cavity and the modulating cell is located between a totally reflecting mirror and a partially reflecting mirror said mirrors comprising said cavity and vibrating means for vibrating one of said mirrors such that the cavity scans a range of wavelengths.

10. A broadband electrical signal spectrum analyser as claimed in claim 9 further including a slit in an image plane behind the partially transparent mirror and a detector means for detecting light passing through the slit.

11. A broadband electrical signal spectrum analyser as claimed in claim 10 wherein said source of light provides white light and further including a collimating lens on one input side of the modulating cell and a Fourier transforming lens on an output side of the modulating cell.

12. A broadband electrical signal spectrum analyser as claimed in claim 11 wherein said modulating cell comprises a high "Q" value modulating cell.

* * * * *